(12) United States Patent
Kagohashi et al.

(10) Patent No.: US 12,538,435 B2
(45) Date of Patent: Jan. 27, 2026

(54) PRINTED WIRING BOARD

(71) Applicant: IBIDEN CO., LTD., Gifu (JP)

(72) Inventors: Susumu Kagohashi, Ogaki (JP); Jun Sakai, Ogaki (JP); Kyohei Yoshikawa, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 198 days.

(21) Appl. No.: 18/420,841

(22) Filed: Jan. 24, 2024

(65) Prior Publication Data
US 2024/0251510 A1    Jul. 25, 2024

(30) Foreign Application Priority Data
Jan. 25, 2023 (JP) .................. 2023-009498

(51) Int. Cl.
| H05K 3/42 | (2006.01) |
|---|---|
| H05K 3/14 | (2006.01) |
| H05K 3/18 | (2006.01) |
| H05K 3/38 | (2006.01) |

(52) U.S. Cl.
CPC .............. *H05K 3/42* (2013.01); *H05K 3/146* (2013.01); *H05K 3/188* (2013.01); *H05K 2203/0723* (2013.01)

(58) Field of Classification Search
CPC .... H05K 3/42; H05K 3/38; H05K 2201/0338; H05K 2201/09563; H05K 1/09; H05K 3/382
See application file for complete search history.

(56) References Cited

U.S. PATENT DOCUMENTS

| 10,285,268 | B2* | 5/2019 | Park ...................... H05K 3/422 |
| 2012/0161323 | A1* | 6/2012 | Kim ...................... H01L 23/498 |
| | | | 438/654 |
| 2020/0163228 | A1* | 5/2020 | Lee ...................... H05K 3/0032 |

FOREIGN PATENT DOCUMENTS

JP    2000-124602 A    4/2000

\* cited by examiner

*Primary Examiner* — Sherman Ng
(74) *Attorney, Agent, or Firm* — Finnegan, Henderson, Farabow, Garrett & Dunner, LLP

(57) ABSTRACT

A printed wiring board includes a first conductor layer, a resin insulating layer, a second conductor layer, and a via conductor formed in an opening of the insulating layer and connecting the first conductor and second conductor layers. The second conductor layer and via conductor include a seed layer having a first portion formed on the surface of the insulating layer, a second portion formed on an inner wall surface in the opening, and a third portion formed on a portion of the first conductor layer exposed by the opening. A thickness of the first portion is greater than a thickness of the second portion and a thickness of the third portion. The seed layer includes a first layer including an alloy including copper, aluminum and one or more metals selected from nickel, zinc, gallium, silicon, and magnesium, and a second layer formed on the first layer and including copper.

20 Claims, 5 Drawing Sheets

PRINTED WIRING BOARD

CROSS-REFERENCE TO RELATED APPLICATIONS

The present application is based upon and claims the benefit of priority to Japanese Patent Application No. 2023-009498, filed Jan. 25, 2023, the entire contents of which are incorporated herein by reference.

BACKGROUND OF THE INVENTION

Field of the Invention

The present invention relates to a printed wiring board.

Description of Background Art

Japanese Patent Application Laid-Open Publication No. 2000-124602 describes a printed wiring board having a resin substrate, a resin insulating layer formed on the resin substrate, and a conductor circuit. The entire contents of this publication are incorporated herein by reference.

SUMMARY OF THE INVENTION

According to one aspect of the present invention, a printed wiring board includes a first conductor layer, a resin insulating layer formed on the first conductor layer, a second conductor layer formed on a surface of the resin insulating layer, and a via conductor formed in an opening of the resin insulating layer such that the via conductor is connecting the first conductor layer and the second conductor layer. The second conductor layer and via conductor are formed such that the second conductor layer and via conductor include a seed layer and an electrolytic plating layer formed on the seed layer, the seed layer has a first portion formed on the surface of the resin insulating layer, a second portion formed on an inner wall surface in the opening of the resin insulating layer, and a third portion formed on the first conductor layer exposed by the opening of the resin insulating layer such that a thickness of the first portion is greater than a thickness of the second portion and is greater than a thickness of the third portion, and the seed layer includes a first layer and a second layer formed on the first layer such that the first layer includes an alloy including copper, aluminum and one or more metals selected from nickel, zinc, gallium, silicon, and magnesium and that the second layer includes copper.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
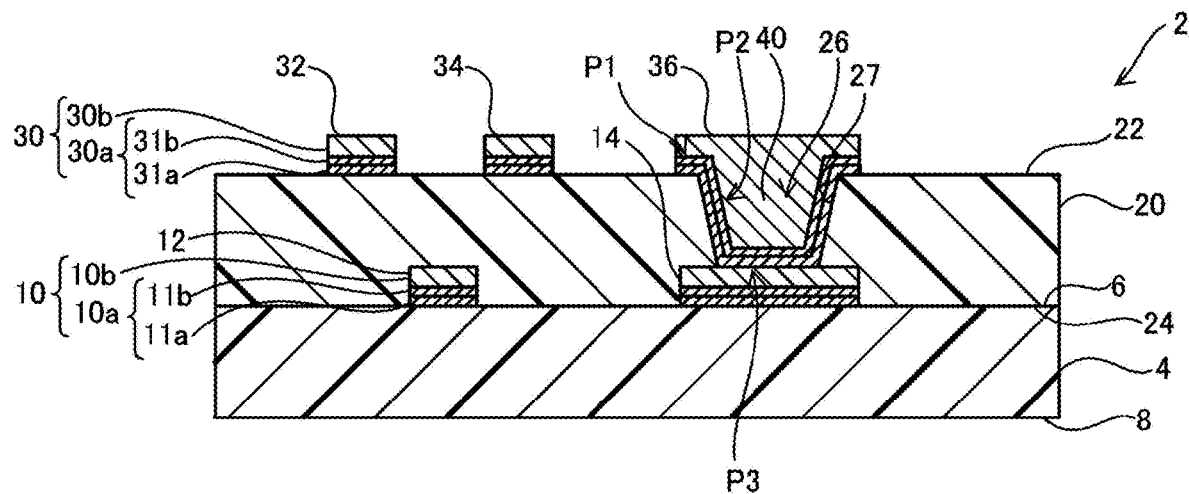
FIG. 1 is a cross-sectional view schematically illustrating a printed wiring board according to an embodiment of the present invention.

Embodiments will now be described with reference to the accompanying drawings, wherein like reference numerals designate corresponding or identical elements throughout the various drawings.

Embodiment

Figure 2:
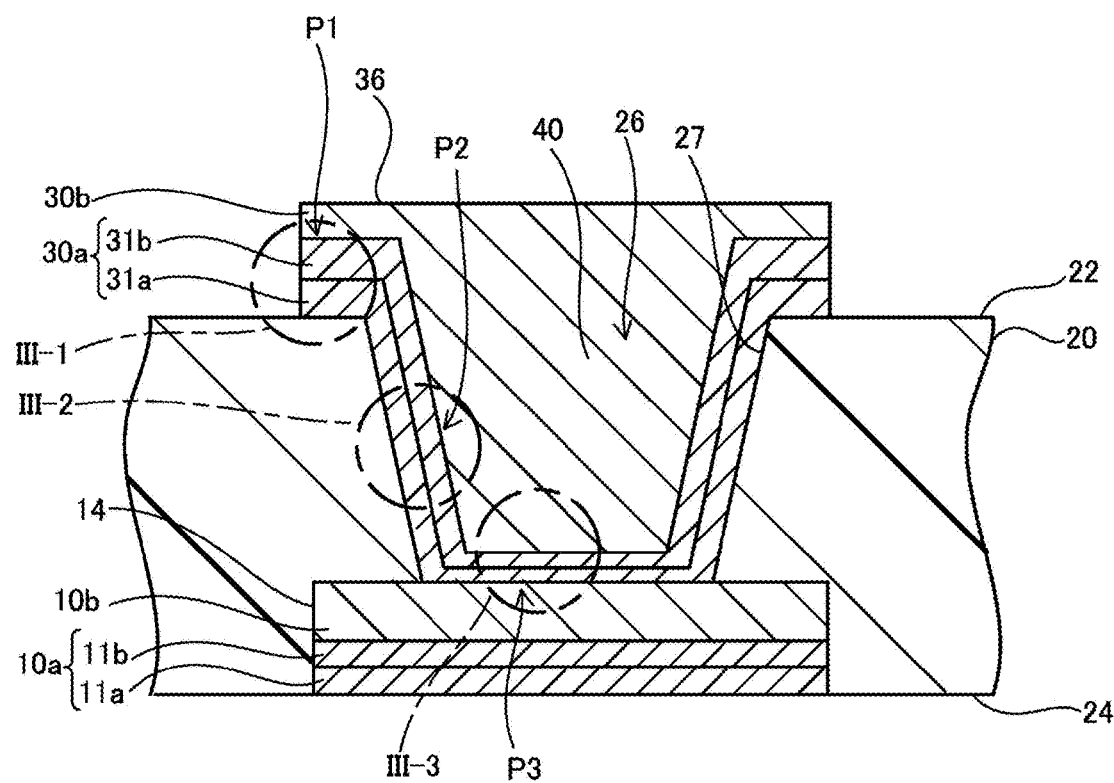
FIG. 2 is an enlarged cross-sectional view schematically illustrating a portion of a printed wiring board according to an embodiment of the present invention.

FIG. 1 is a cross-sectional view illustrating a printed wiring board 2 of an embodiment. FIG. 2 is an enlarged cross-sectional view illustrating a part of the printed wiring board 2 of the embodiment. As illustrated in FIG. 1, the printed wiring board 2 includes an insulating layer 4, a first conductor layer 10, a resin insulating layer 20, a second conductor layer 30, and a via conductor 40.

The insulating layer 4 is formed using a resin. The insulating layer 4 may contain inorganic particles such as silica particles or alumina particles. The insulating layer 4 may contain a reinforcing material such as a glass cloth. The insulating layer 4 has a third surface 6 and a fourth surface 8 on the opposite side with respect to the third surface 6.

The first conductor layer 10 is formed on the third surface 6 of the insulating layer 4. The first conductor layer 10 includes a signal wiring 12 and a pad 14. Although not illustrated in the drawing, the first conductor layer 10 also includes conductor circuits other than the signal wiring 12 and the pad 14. The first conductor layer 10 is mainly formed of copper. The first conductor layer 10 is formed of a seed layer (10a) on the insulating layer 4 and an electrolytic plating layer (10b) on the seed layer (10a). The seed layer (10a) is formed by sputtering. The seed layer (10a) is formed of a first layer (11a) on the third surface 6 and a second layer (11b) on the first layer (11a). The first layer (11a) is in contact with the insulating layer 4. The second layer (11b) is not essential.

The first layer (11a) is formed of an alloy containing copper, aluminum, and a specific metal. The alloy preferably contains one type of specific metal, or two types of specific metals, or three types of specific metals. The aluminum content in the alloy is 1.0 at % or more and 15.0 at % or less. An example of a specific metal is silicon. The silicon content in the alloy is 0.5 at % or more and 10.0 at % or less. The first layer (11a) may contain impurities. Examples of the impurities are oxygen and carbon. The first layer (11a) can contain oxygen or carbon. The first layer (11a) can contain oxygen and carbon. In the embodiment, the alloy further contains carbon. The carbon content in the alloy is 50 ppm or less. The alloy further contains oxygen. The oxygen content in the alloy is 100 ppm or less. The values of the contents of the elements described above are examples. Among the elements that form the first layer (11a), the copper content is the largest. The aluminum content is the next largest. The content of the specific metal is less than the aluminum content. Therefore, copper is a primary metal, aluminum is a first secondary metal, and the specific metal is a second secondary metal. The content of the impurities is smaller than the content of the specific metal.

The second layer (11b) is formed of copper. A content of copper forming the second layer (11b) is 99.9 at % or more. The copper content in the second layer (11b) is preferably 99.95 at % or more. The electrolytic plating layer (10b) is formed of copper. A content of copper forming the electrolytic plating layer (10b) is 99.9 at % or more. The copper content in the electrolytic plating layer (10b) is preferably 99.95 at % or more.

The resin insulating layer 20 is formed on the third surface 6 of the insulating layer 4 and on the first conductor layer 10. The resin insulating layer 20 has a first surface 22 and a second surface 24 on the opposite side with respect to the first surface 22. The second surface 24 of the resin insulating layer 20 faces the first conductor layer 10. The resin insulating layer 20 has an opening 26 that exposes the pad 14. The resin insulating layer 20 is formed of an epoxy resin and inorganic particles dispersed in the epoxy resin. Examples of the resin include a thermosetting resin and a photocurable resin. Examples of the inorganic particles include silica particles and alumina particles. The inorganic particles may be glass particles.

The first surface 22 of the resin insulating layer 20 is formed only of the resin. No inorganic particles are exposed from the first surface 22. No unevenness is formed on the first surface 22 of the resin insulating layer 20. The first surface 22 is not roughened. The first surface 22 is formed smooth.

The second conductor layer 30 is formed on the first surface 22 of the resin insulating layer 20. The second conductor layer 30 includes a first signal wiring 32, a second signal wiring 34, and a land 36. Although not illustrated in the drawing, the second conductor layer 30 also includes conductor circuits other than the first signal wiring 32, the second signal wiring 34, and the land 36. The first signal wiring 32 and the second signal wiring 34 form a pair wiring. The second conductor layer 30 is mainly formed of copper. The second conductor layer 30 is formed by a seed layer (30a) on the first surface 22 and an electrolytic plating layer (30b) on the seed layer (30a). The seed layer (30a) is formed by sputtering. The seed layer (30a) is formed of a first layer (31a) on the first surface 22 and a second layer (31b) on the first layer (31a). The first layer (31a) is in contact with the first surface 22. The second layer (31b) is not essential.

The first layer (31a) that forms the second conductor layer 30 is similar to the first layer (11a) that forms the first conductor layer 10.

The second layer (31b) that forms the second conductor layer 30 is similar to the second layer (11b) that forms the first conductor layer 10. The electrolytic plating layer (30b) is formed of copper.

The via conductor 40 is formed in the opening 26. The via conductor 40 connects the first conductor layer 10 and the second conductor layer 30. In FIG. 1, the via conductor 40 connects the pad 14 and the land 36. The via conductor 40 is formed of a seed layer (30a) and an electrolytic plating layer (30b) on the seed layer (30a). The seed layer (30a) that forms the via conductor 40 and the seed layer (30a) that forms the second conductor layer 30 are common. The seed layer (30a) that forms the via conductor 40 is formed of a first layer (31a), which is formed on the inner wall surface 27 of the opening 26 and on the pad 14 exposed from the opening 26, and a second layer (31b) on the first layer (31a). The first layer (31a) is in contact with the upper surface of the pad 14 and the inner wall surface 27.

Figure 3A:
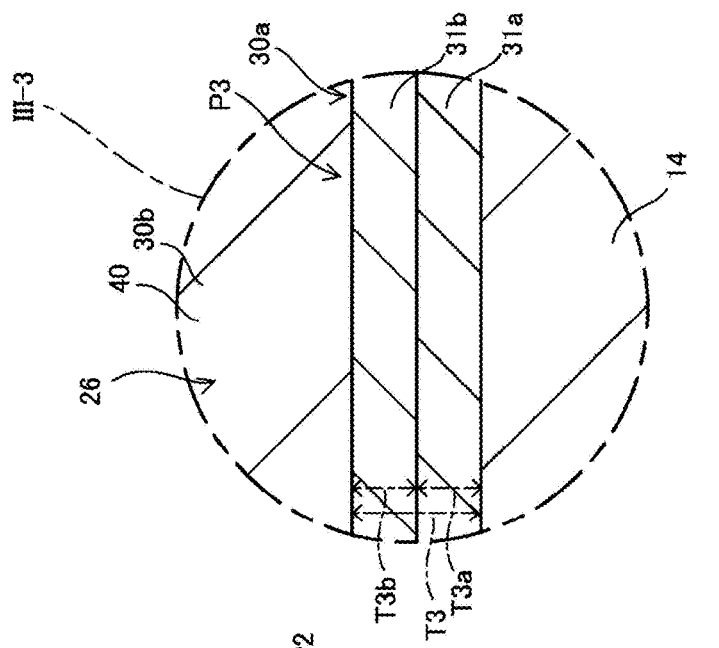
FIGS. 3A-3C are each an enlarged cross-sectional view schematically illustrating a part of a seed layer.
Figure 3B:
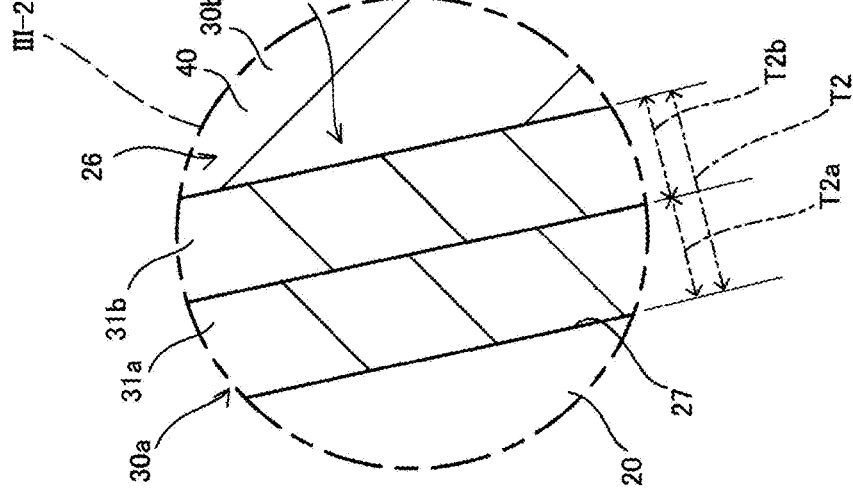
Figure 3C:
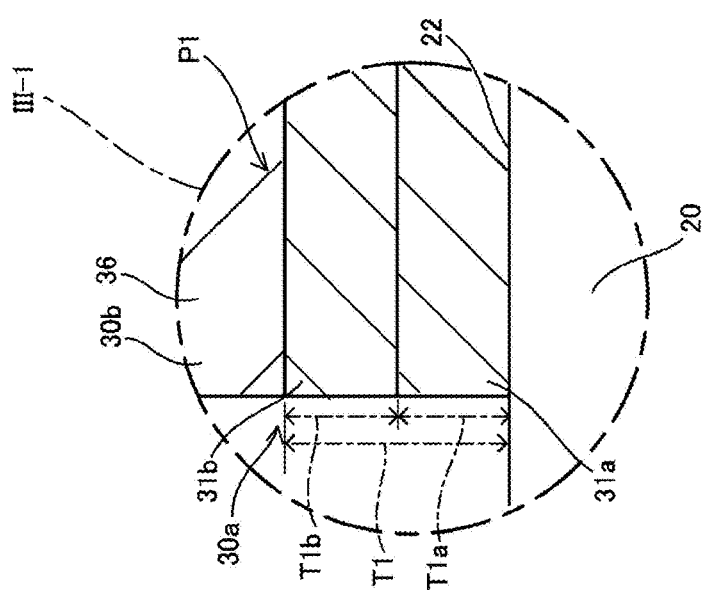

The seed layer (30a) has a first portion (P1) on the first surface 22, a second portion (P2) on the inner wall surface 27 of the opening 26, and a third portion (P3) on the pad 14 exposed from the opening 26. FIGS. 3A-3C are each an enlarged cross-sectional view illustrating a part of the seed layer (30a). FIG. 3A illustrates a portion (the first portion (P1)) indicated by a symbol (III-1) in FIG. 2. FIG. 3B illustrates a portion (the second portion (P2)) indicated by a symbol (III-2) in FIG. 2. FIG. 3C illustrates a portion (the third portion (P3)) indicated by a symbol (III-3) in FIG. 2. As illustrated in FIGS. 3A-3C, a thickness (T1) of the first portion (P1) is greater than a thickness (T2) of the second portion (P2) and a thickness (T3) of the third portion (P3). Further, the thickness (T2) of the second portion (P2) is equal to or greater than the thickness (T3) of the third portion (P3).

When the seed layer (30a) is formed of multiple layers, the thickness (T1), the thickness (T2) and the thickness (T3) are each a total thickness of the layers. A thickness (T1a) of the first portion (P1) of the first layer (31a) is greater than a thickness (T2a) of the second portion (P2) of the first layer (31a) and a thickness (T3a) of the third portion (P3) of the first layer (31a). Further, the thickness (T2a) of the second portion (P2) of the first layer (31a) is equal to or greater than the thickness (T3a) of the third portion (P3) of the first layer (31a). Thicknesses of the other layers have similar relationships to those of the thicknesses of the first layer (31a). Therefore, when the seed layer (30a) is formed of two layers, a thickness (T1b) of the first portion (P1) of the second layer (31b) is greater than a thickness (T2b) of the second portion (P2) of the second layer (31b) and a thickness (T3b) of the third portion (P3) of the second layer (31b). Further, the thickness (T2b) of the second portion (P2) of the second layer (31b) is equal to or greater than the thickness (T3b) of the third portion (P3) of the second layer (31b).

A ratio of the thickness (T2) of the second portion (P2) to the thickness (T1) of the first portion (P1) ((the thickness (T2) of the second portion (P2))/(the thickness (T1) of the first portion (P1))) is 0.3 or more and 0.6 or less. A ratio of the thickness (T3) of the third portion (P3) to the thickness (T1) of the first portion (P1) ((the thickness (T3) of the third portion (P3))/(the thickness (T1) of the first portion (P1))) is 0.25 or more and 0.40 or less.

A thickness of the second layer (31b) is greater than a thickness of the first layer (31a). The thickness (T1b) is greater than the thickness (T1a). The thickness (T2b) is greater than the thickness (T2a). The thickness (T3b) is greater than the thickness (T3a). A low-resistance seed layer (30a) can be formed.

When the seed layer (30a) is formed of only the first layer (31a), the thickness (T1a) of the first portion (P1) of the first layer (31a) is greater than the thickness (T2a) of the second portion (P2) of the first layer (31a) and the thickness (T3a) of the third portion (P3) of the first layer (31a). Further, the thickness (T2a) of the second portion (P2) of the first layer (31a) is equal to or greater than the thickness (T3a) of the third portion (P3) of the first layer (31a).

The thickness (T1) of the first portion (P1) of the seed layer (30a) is 0.02 μm or more and 1.0 μm or less. The thickness (T1a) of the first portion (P1) of the first layer (31a) is 0.01 μm or more and 0.5 μm or less. The thickness (T1b) of the first portion (P1) of the second layer (31b) is 0.01 μm or more and 0.9 μm or less. When the thickness (T1) of the first portion (P1) of the seed layer (30a) is less than 0.02 μm, for example, adhesion strength between the resin insulating layer 20 and the seed layer (30a) is low. When the thickness (T1) of the first portion (P1) exceeds 1.0 μm, an etching amount for removing the seed layer (30a) is large. It is difficult to control a wiring width.

The thickness (T2) of the second portion (P2) of the seed layer (30a) on the inner wall surface 27 of the opening 26 is 0.006 μm or more and 0.6 μm or less. The thickness (T2a) of the second portion (P2) of the first layer (31a) is 0.003 μm or more and 0.3 μm or less. The thickness (T2b) of the second portion (P2) of the second layer (31b) is 0.003 μm or more and 0.6 μm or less. The inner wall surface 27 of the opening 26 is roughened with plasma.

The thickness (T3) of the third portion (P3) of the seed layer (30a) on the pad 14 exposed from the opening 26 is 0.005 μm or more and 0.4 μm or less. The thickness (T3a) of the third portion (P3) of the first layer (31a) is 0.002 μm or more and 0.2 μm or less. The thickness (T3b) of the third portion (P3) of the second layer (31b) is 0.002 μm or more and 0.4 μm or less. The third portion (P3) is a connecting portion between the via conductor 40 and the pad 14.

Method for Manufacturing Printed Wiring Board

Figure 4A:
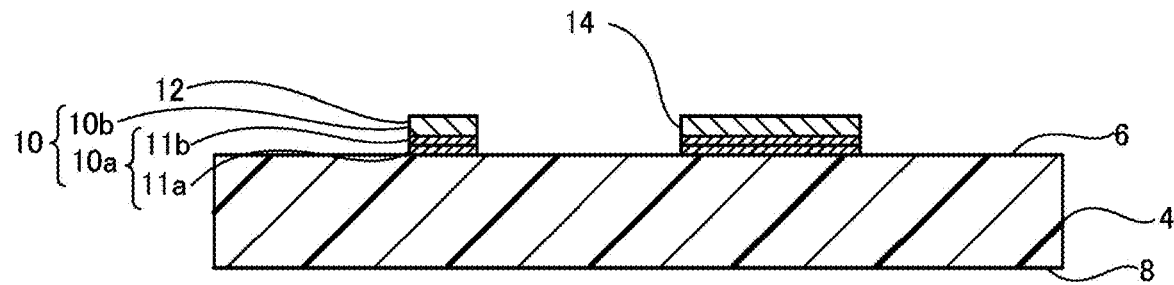
FIG. 4A is a cross-sectional view schematically illustrating a method for manufacturing a printed wiring board according to an embodiment of the present invention.

FIGS. 4A-4G illustrate a method for manufacturing the printed wiring board 2 of the embodiment. FIGS. 4A-4G are cross-sectional views. FIG. 4A illustrates the insulating layer 4 and the first conductor layer 10 formed on the third surface 6 of the insulating layer 4. The first conductor layer 10 is formed using a semi-additive method. The first layer (11a) and the second layer (11b) are formed by sputtering. The first layer (11a) is formed of an alloy containing copper, aluminum, and a specific metal. An example of a specific metal is silicon or nickel. The second layer (11b) is formed of copper. The electrolytic plating layer (10b) is formed by electrolytic plating. The electrolytic plating layer (10b) is formed of copper.

Figure 4B:
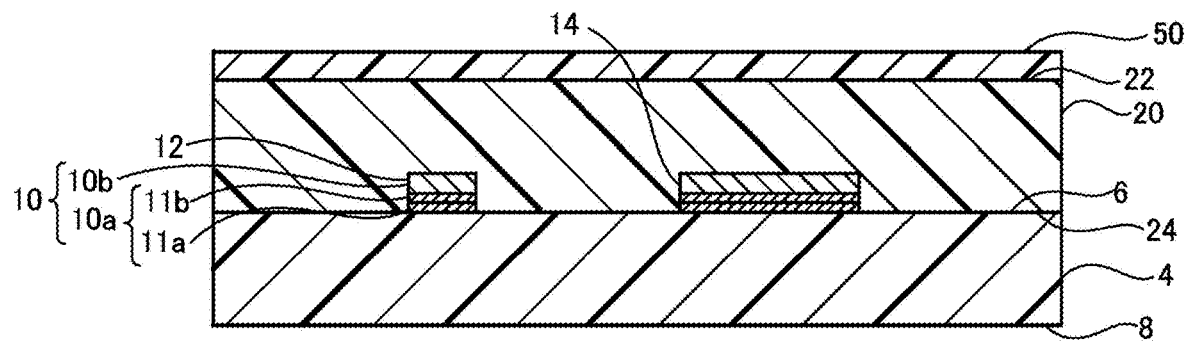
FIG. 4B is a cross-sectional view schematically illustrating a method for manufacturing a printed wiring board according to an embodiment of the present invention.

As illustrated in FIG. 4B, the resin insulating layer 20 and a protective film 50 are formed on the insulating layer 4 and the first conductor layer 10. The second surface 24 of the resin insulating layer 20 faces the third surface 6 of the insulating layer 4. The protective film 50 is formed on the first surface 22 of the resin insulating layer 20.

The protective film 50 completely covers the first surface 22 of the resin insulating layer 20. An example of the protective film 50 is a film formed of polyethylene terephthalate (PET). A release agent is formed between the protective film 50 and the resin insulating layer 20.

Figure 4C:
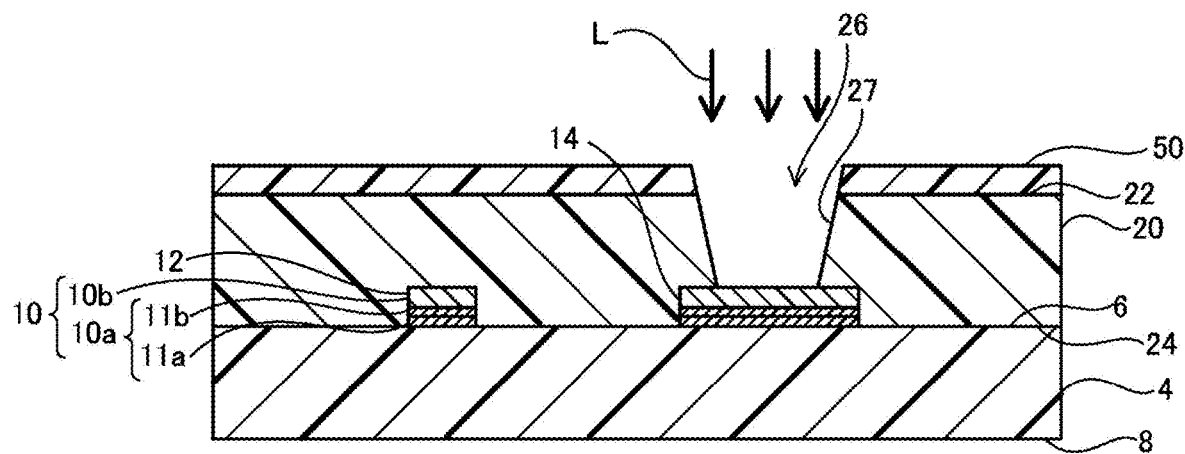
FIG. 4C is a cross-sectional view schematically illustrating a method for manufacturing a printed wiring board according to an embodiment of the present invention.

As illustrated in FIG. 4C, laser (L) is irradiated from above the protective film 50. The laser (L) penetrates the protective film 50 and the resin insulating layer 20 at the same time. The opening 26 for a via conductor reaching the pad 14 of the first conductor layer 10 is formed. The laser (L) is, for example, UV laser, or $CO_2$ laser. The pad 14 is exposed from the opening 26. When the opening 26 is formed, the first surface 22 is covered by the protective film 50. Therefore, when the opening 26 is formed, even when the resin scatters, adherence of the resin to the first surface 22 is suppressed.

After that, the inside of the opening 26 is cleaned. Resin residues generated when the opening 26 is formed are removed. The cleaning of the inside of the opening 26 is performed using plasma. That is, the cleaning is performed with a dry process. The cleaning includes a desmear treatment. The inner wall surface 27 of the opening 26 is roughened with plasma. The inner wall surface 27 of the opening 26 is formed of the resin and the inorganic particles that form the resin insulating layer 20. On the other hand, the first surface 22 of the resin insulating layer 20 is covered by the protective film 50. The first surface 22 is not affected by the plasma. No unevenness is formed on the first surface 22 of the resin insulating layer 20. The first surface 22 is not roughened. The first surface 22 is formed smooth.

Figure 4D:
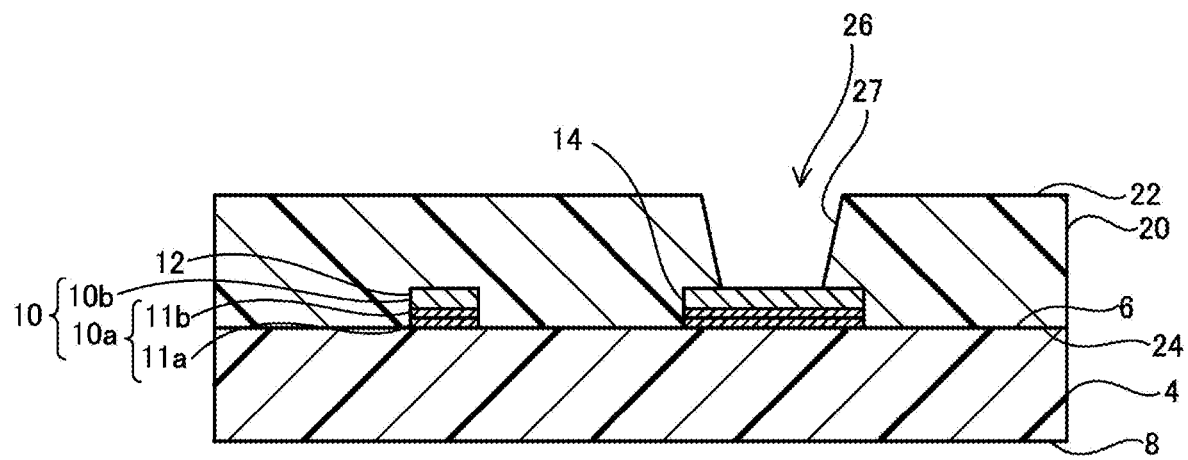
FIG. 4D is a cross-sectional view schematically illustrating a method for manufacturing a printed wiring board according to an embodiment of the present invention.

As illustrated in FIG. 4D, the protective film 50 is removed from the resin insulating layer 20. After the protective film 50 is removed, no roughening of the first surface 22 of the resin insulating layer 20 is performed.

Figure 4E:
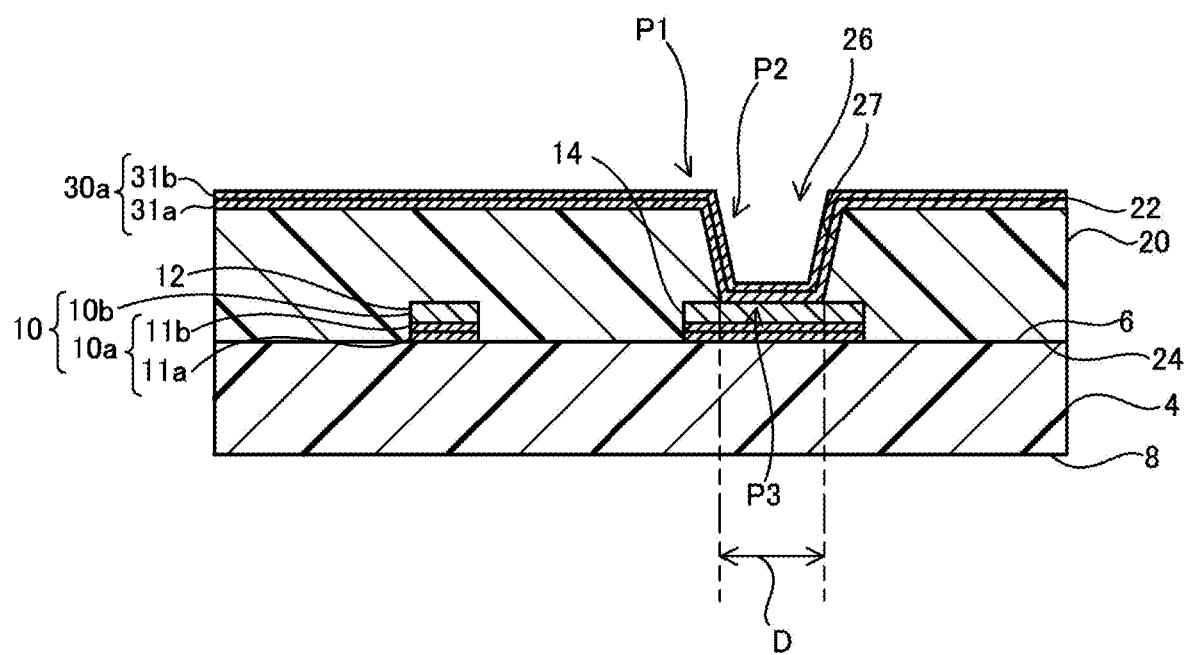
FIG. 4E is a cross-sectional view schematically illustrating a method for manufacturing a printed wiring board according to an embodiment of the present invention.

As illustrated in FIG. 4E, the seed layer (30a) is formed on the first surface 22 of the resin insulating layer 20. The seed layer (30a) is formed by sputtering. The formation of the seed layer (30a) is performed in a dry process. For example, sputtering is performed via a mask. First, a first mask covering the opening 26 for a via conductor is formed on the resin insulating layer 20. The first mask exposes only the first surface 22 of the resin insulating layer 20. The first portion (P1) having the thickness (T1a) is formed on the first surface 22 of the resin insulating layer 20 via the first mask. The first mask is removed. A second mask exposing only the inner wall surface 27 of the opening 26 for a via conductor is formed on the resin insulating layer 20. The second portion (P2) having the thickness (T2a) is formed on the inner wall surface 27 via the second mask. The second mask is removed. A third mask exposing only the pad 14 exposed from the opening 26 for a via conductor is formed on the resin insulating layer 20. The third portion (P3) having the thickness (T3a) is formed on the pad 14 via the third mask. The third mask is removed. As a result, the first layer (31a) is formed on the first surface 22. The first layer (31a) is formed on the inner wall surface 27 and the pad 14, which are exposed from the opening 26. After that, the second layer (31b) is formed on the first layer (31a). A method for forming the first layer (31a) and a method for forming the second layer (31b) are the same. The first layer (31a) is formed of an alloy containing copper, aluminum, and a specific metal (for example, silicon). The second layer (31b) is formed of copper.

The first layer (31a) and the second layer (31b) are formed by sputtering. Examples of sputtering conditions are described below. A distance between a target and the first surface 22 of the resin insulating layer 20 is 50 mm or more and 250 mm or less. A voltage is 15 eV or more and 50 eV or less. A gas concentration is 0.1 Pa or more and 1.0 Pa or less. For example, by changing a processing time, the thickness (T1) of the first portion (P1) of the seed layer (30a), the thickness (T2) of the second portion (P2) of the seed layer (30a), and the thickness (T3) of the third portion (P3) of the seed layer (30a) can be adjusted. The thickness (T1a) of the first portion (P1) of the first layer (31a) is greater than the thickness (T2a) of the second portion (P2) of the first layer (31a) and the thickness (T3a) of the third portion (P3) of the first layer (31a) (see FIGS. 3A-3C). Further, the thickness (T2a) of the second portion (P2) of the first layer (31a) is equal to or greater than the thickness (T3a) of the third portion (P3) of the first layer (31a). The thickness (T1b) of the first portion (P1) of the second layer (31b) is greater than the thickness (T2b) of the second portion (P2) of the second layer (31b) and the thickness (T3b) of the third portion (P3) of the second layer (31b). Further, the thickness (T2b) of the second portion (P2) of the second layer (31b) is equal to or greater than the thickness (T3b) of the third portion (P3) of the second layer (31b). As a result, the thickness (T1) of the first portion (P1) of the seed layer (30a) is greater than the thickness (T2) of the second portion (P2) and the thickness (T3) of the third portion (P3). The thickness (T2) of the second portion (P2) of the seed layer (30a) is equal to or greater than the thickness (T3) of the third portion (P3).

A ratio of the thickness of the second layer (31b) to the thickness of the first layer (31a) ((the thickness of the second layer (31b))/(the thickness of the first layer (31a))) is 1.2 or more and 2 or less. A ratio ((the thickness (T1b))/(the thickness (T1a))), a ratio ((the thickness (T2b))/(the thickness (T2a))), and a ratio ((the thickness (T3b))/(the thickness (T3a))) are 1.2 or more and 2 or less.

The first portion (P1) is formed on the first surface 22 of the resin insulating layer 20, and the second portion (P2) is formed on the inner wall surface 27 of the resin insulating layer 20. The first portion (P1) and the second portion (P2) are both formed on the resin insulating layer 20. The first portion (P1) forms the seed layer (30a) of the land 36, the first signal wiring 32, and the second signal wiring 34. The second portion (P2) forms the seed layer (30a) of the via conductor 40. A thermal expansion coefficient of the resin insulating layer 20 and a thermal expansion coefficient of the seed layer (30a) are different from each other. Therefore, it is thought that, when the printed wiring board 2 receives a thermal shock, a stress acts on the seed layer (30a). Normally, the first signal wiring 32 and the second signal wiring 34 include portions that are bent considerably longer than the via conductor 40. Therefore, large stresses are expected to concentrate in the bent portions in the first signal wiring 32 and the second signal wiring 34. In contrast, the via conductor 40 is short and formed substantially straight. Therefore, concentration of a stress is unlikely to occur in the via conductor 40. Therefore, in order to avoid breakage of the seed layer (30a) on the first surface 22 of the resin insulating layer 20, the thickness of the seed layer (30a) forming the first signal wiring 32 and the second signal wiring 34 is preferably large. In contrast, the thickness of the seed layer (30a) on the inner wall surface 27 forming the via conductor 40 may be small. Therefore, in the embodiment, the thickness (T1) is greater than the thickness (T2).

By reducing the thickness (T2) of the second portion (P2), the time required to form the seed layer (30a) can be shortened.

Figure 4F:
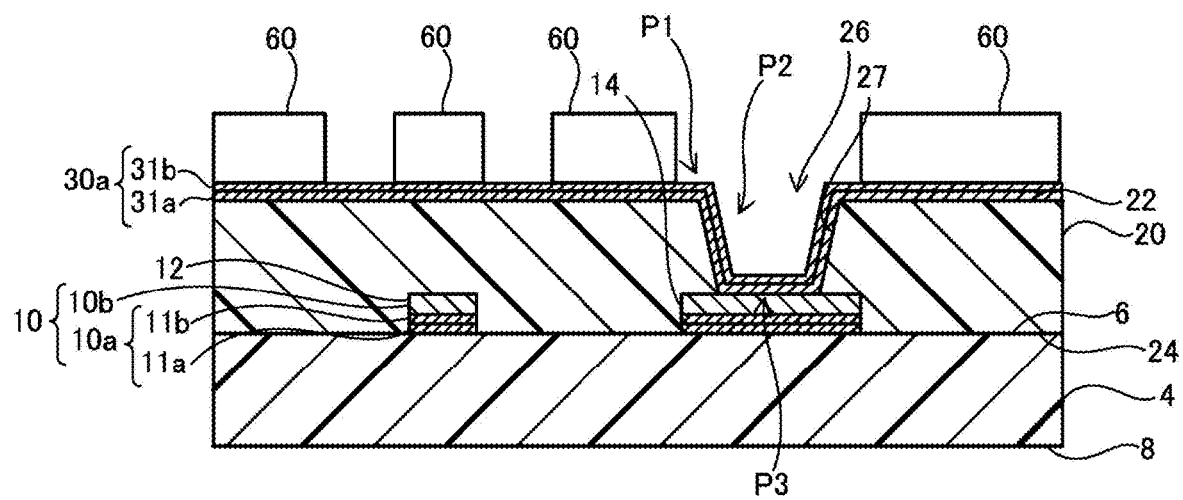
FIG. 4F is a cross-sectional view schematically illustrating a method for manufacturing a printed wiring board according to an embodiment of the present invention.

As illustrated in FIG. 4F, a plating resist 60 is formed on the seed layer (30a). The plating resist 60 has openings for forming the first signal wiring 32, the second signal wiring 34, and the land 36 (FIG. 1).

Figure 4G:
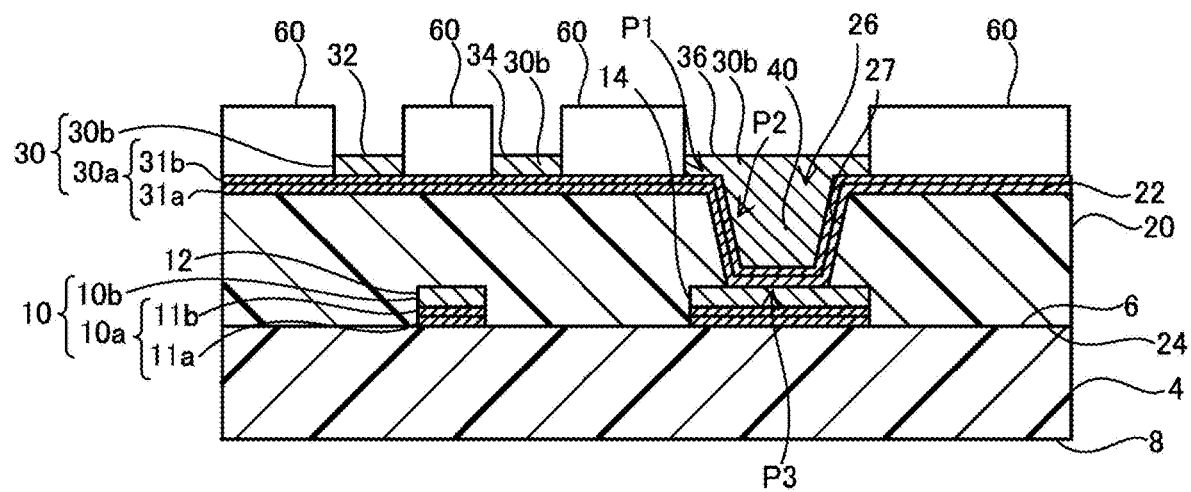
FIG. 4G is a cross-sectional view schematically illustrating a method for manufacturing a printed wiring board according to an embodiment of the present invention.

As illustrated in FIG. 4G, the electrolytic plating layer (30b) is formed on the seed layer (30a) exposed from the plating resist 60. The electrolytic plating layer (30b) is formed of copper. The electrolytic plating layer (30b) fills the opening 26. The first signal wiring 32, the second signal wiring 34, and the land 36 are formed by the seed layer (30a) and the electrolytic plating film (30b) on the first surface 22. The second conductor layer 30 is formed. The via conductor 40 is formed by the seed layer (30a) and the electrolytic plating film (30b) in the opening 26. The via conductor 40 connects the pad 14 and the land 36. The first signal wiring 32 and the second signal wiring 34 form a pair wiring.

When the thickness (T2) is small, a volume of the opening 26 for the via conductor 40 after the formation of the seed layer (30a) can be increased. Therefore, an electrolytic plating solution can easily enter the opening 26. A void is unlikely to form in the electrolytic plating layer (30b) that forms the via conductor 40. A via conductor 40 having a low resistance can be formed. Even when an opening diameter (D) of the opening 26 (a diameter on the pad 14) (see FIG. 4E) is 30 µm or less, a via conductor 40 that does not contain a void can be formed. Even when the opening diameter (D) is 10 µm or more and 25 µm or less, connection reliability via the via conductor 40 is stable for a long period of time. In this way, by reducing the thickness (T2) of the second portion (P2), cost, productivity and reliability can be improved. Therefore, the thickness (T2) is preferably smaller than thickness (T1).

After that, the plating resist 60 is removed. The seed layer (30a) exposed from the electrolytic plating layer (30b) is removed. The second conductor layer 30 and the via conductor 40 are formed at the same time. The printed wiring board 2 (FIG. 1) of the embodiment is obtained.

The electrolytic plating layer (10b) forming the pad 14 and the electrolytic plating layer (30b) forming the via conductor 40 sandwich the seed layer (30a) forming the third portion (P3). The seed layer (30a) is formed by sputtering. Since electrolytic plating and sputtering are different methods, it is thought that, when the printed wiring board 2 is subjected to a thermal shock, a contraction amount or an expansion amount is different between the two. Therefore, the connection reliability via the via conductor 40 is likely to deteriorate between the seed layer (30a) and the electrolytic plating layer (10b) forming the pad 14. Or, the connection reliability is likely to deteriorate between the seed layer (30a) and the electrolytic plating layer (30b) forming the via conductor 40. In order to reduce a degree of influence of the sputtered seed layer (30a) with respect to the connection reliability, the thickness of the sputtered seed layer (30a) on the pad 14 is preferably small. Therefore, in the embodiment, the thickness (T3) of the third portion (P3) is reduced. Specifically, in the embodiment, the thickness (T3) is smaller than the thickness (T1). The thickness (T3) is preferably smaller than the thickness (T2). As a result, even when the via conductor 40 is formed of the sputtered seed layer (30a) and the electrolytic plating layer (30b), a printed wiring board 2 with high connection reliability can be provided.

In the printed wiring board 2 of the embodiment (FIGS. 1 and 2), the first layer (31a) of the seed layer (30a) is formed of an alloy containing copper, aluminum and a specific metal. Aluminum has high ductility and high malleability. Therefore, adhesion between resin insulating layer 20 and the seed layer (30a) is high. It is thought that, even when the resin insulating layer 20 expands or contracts, the seed layer (30a) containing aluminum can follow the expansion or contraction. Further, the thickness (T1) of the first portion (P1) of the seed layer (30a) is greater than the thickness (T2) of the second portion (P2) and the thickness (T3) of the third portion (P3). The seed layer (30a) is unlikely to adversely affect a signal transmission speed or power supply via the via conductors 40. A high quality printed wiring board 2 is provided.

When a signal or power propagates from the pad 14 to the via conductor 40, the signal or power passes through the first layer (31a) of the seed layer (30a). Resistivity of aluminum contained in the alloy forming the first layer (31a) is higher than that of copper. Therefore, when a signal or power propagates in the first layer (31a), a distance of the propagation through the first layer (31a) is preferably short. In the embodiment, the thickness (T1a) of the first portion (P1) of the first layer (31a) is greater than the thickness (T2a) of the second portion (P2) and the thickness (T3a) of the third portion (P3). Therefore, when a signal or power propagates from the pad 14 to the via conductor 40, a distance of the propagation through the third portion (P3) of the first layer (31a) is short. Further, a signal or power is likely to directly propagate from the third portion (P3) of the seed layer (30a) to the electrolytic plating layer (30b). It is preferred that a signal or power propagates from the third portion (P3) to the electrolytic plating layer (30b) that forms the via conductor 40 without propagating from the third portion (P3) to the second portion (P2). In the embodiment, the thickness (T2) of the second portion (P2) is smaller than the thickness (T1) of the first portion (P1). Therefore, resistance of the second portion (P2) can be increased. Since current flows through a portion with low resistance, a signal or power is likely to directly propagate from the third portion (P3) to the electrolytic plating layer (30b) that forms the via conductor 40. The seed layer (30a) is unlikely to adversely affect a signal transmission speed or power supply via the via conductors 40. Even when a logic IC is mounted on the printed wiring board 2, the logic IC is unlikely to malfunction.

In the printed wiring board 2 of the embodiment, the first surface 22 of the resin insulating layer 20 is formed of resin only. No inorganic particles are exposed from the first surface 22. No unevenness is formed on the first surface 22. An increase in standard deviation of a relative permittivity in a portion near the first surface 22 of the resin insulating layer 20 is suppressed. The relative permittivity of the first surface 22 does not significantly vary depending on a location. Even when the first signal wiring 32 and the second signal wiring 34 are in contact with the first surface 22, a difference in propagation speed of an electric signal between the first signal wiring 32 and the second signal wiring 34 can be reduced. Therefore, in the printed wiring board 2 of the embodiment, noise is suppressed. Even when a logic IC is mounted on the printed wiring board 2 of the embodiment, data transmitted via the first signal wiring 32 and data transmitted via the second signal wiring 34 arrive at the logic IC substantially without delay. Malfunction of a logic IC can be suppressed. Even when a length of the first signal wiring 32 and a length of the second signal wiring 34 are 5 mm or more, a difference in propagation speed between the two can be reduced. Even when the length of the first signal wiring 32 and the length of the second signal wiring 34 are 10 mm or more and 20 mm or less, malfunction of the logic IC can be suppressed. Although not illustrated in the drawings, each side of the printed wiring board 2 has a length of 50 mm or more. The length of each side is preferably 100 mm or more. The length of each side is 250 mm or less. A high quality printed wiring board 2 is provided.

First Alternative Example

In a first alternative example of the embodiment, the specific metal contained in the alloy forming the first layers (11a, 31a) of the seed layers (10a, 30a) is at least one of nickel, zinc, gallium, silicon, and magnesium.

Second Alternative Example

In a second alternative example of the embodiment, the alloy forming the first layers (11a, 31a) of the seed layers (10a, 30a) does not contain carbon.

Third Alternative Example

In a third alternative example of the embodiment, the alloy forming the first layers (11a, 31a) of the seed layers (10a, 30a) does not contain oxygen.

Fourth Alternative Example

In a fourth alternative example of the embodiment, the resin insulating layer 20 contains glass particles as the inorganic particles. The glass particles and the resin in the resin insulating layer 20 form the inner wall surface 27 of the opening 26. In this case, the first layer (31a) containing aluminum and the inner wall surface 27 are strongly bonded to each other. The reason for this is thought to be that the glass particles and aluminum in the first layer (31a) bond through oxygen in the glass.

Japanese Patent Application Laid-Open Publication No. 2000-124602 describes a printed wiring board having a resin substrate, a resin insulating layer formed on the resin substrate, and a conductor circuit. The conductor circuit is formed on the resin insulating layer via an alloy layer containing a specific metal. For example, the specific metal is shown in paragraph 8 of Japanese Patent Application Laid-Open Publication No. 2000-124602.

In the printed wiring board having the alloy layer of Japanese Patent Application Laid-Open Publication No. 2000-124602, it is thought that adhesion between the conductor circuit and the resin insulating layer is insufficient.

A printed wiring board according to an embodiment of the present invention includes: a first conductor layer; a resin insulating layer that is formed on the first conductor layer, and has an opening for a via conductor exposing the first conductor layer, a first surface, and a second surface on the opposite side with respect to the first surface; a second conductor layer that is formed on the first surface of the resin insulating layer; and a via conductor that is formed in the opening and connects the first conductor layer and the second conductor layer. The second conductor layer and the via conductor are formed by a seed layer and an electrolytic plating layer formed on the seed layer. The seed layer has a first portion on the first surface, a second portion on an inner wall surface of the opening, and a third portion on the first conductor layer exposed from the opening, and a thickness of the first portion is greater than a thickness of the second portion and a thickness of the third portion. The seed layer is formed by a first layer and a second layer formed on the first layer. The first layer is formed of an alloy containing copper, aluminum, and a specific metal. The specific metal is at least one of nickel, zinc, gallium, silicon, and magnesium. The second layer is formed of copper.

In a printed wiring board according to an embodiment of the present invention, the first layer of the seed layer is formed of an alloy containing copper, aluminum and a specific metal. Aluminum has high ductility and high malleability. Therefore, adhesion between resin insulating layer and the seed layer is high. A printed wiring board with stable performance is obtained.

The second portion is thinner than the first portion. A volume of the opening for a via conductor after the formation of the seed layer can be increased. Even when a diameter of the opening for a via conductor is small, the opening for a via conductor can be filled with the electrolytic plating layer.

The first conductor layer and the via conductor are connected via the third portion. The third portion is thinner than the first portion. Influence of the third portion can be reduced. Connection resistance via the third portion is unlikely to increase.

Obviously, numerous modifications and variations of the present invention are possible in light of the above teachings. It is therefore to be understood that within the scope of the appended claims, the invention may be practiced otherwise than as specifically described herein.

The invention claimed is:

1. A printed wiring board, comprising:
a first conductor layer;
a resin insulating layer formed on the first conductor layer;
a second conductor layer formed on a surface of the resin insulating layer; and
a via conductor formed in an opening of the resin insulating layer such that the via conductor is connecting the first conductor layer and the second conductor layer,
wherein the second conductor layer and via conductor are formed such that the second conductor layer and via conductor include a seed layer and an electrolytic plating layer formed on the seed layer, the seed layer has a first portion formed on the surface of the resin insulating layer, a second portion formed on an inner wall surface in the opening of the resin insulating layer, and a third portion formed on a portion of the first conductor layer exposed by the opening of the resin insulating layer such that a thickness of the first portion is greater than a thickness of the second portion and is greater than a thickness of the third portion, the seed layer includes a first layer and a second layer formed on the first layer such that the first layer includes an alloy comprising copper, aluminum and at least one metal selected from the group consisting of nickel, zinc, gallium, silicon, and magnesium and that the second layer includes copper, and the seed layer of the second conductor layer and via conductor is formed such that a thickness of the first portion in the first layer is greater than a thickness of the second portion in the first layer and is greater than a thickness of the third portion in the first layer and that a thickness of the first portion in the second layer is greater than a thickness of the second portion in the second layer and is greater than a thickness of the third portion in the second layer.

2. The printed wiring board according to claim 1, wherein the seed layer of the second conductor layer and via conductor is formed such that the thickness of the second portion is equal to or greater than the thickness of the third portion.

3. The printed wiring board according to claim 1, wherein the seed layer of the second conductor layer and via conductor is formed such that the thickness of the second portion in the first layer is equal to or greater than the thickness of the third portion in the first layer and that the thickness of the second portion in the second layer is equal to or greater than the thickness of the third portion in the second layer.

4. The printed wiring board according to claim 1, wherein the seed layer of the second conductor layer and via conductor is formed such that a ratio of the thickness of the second portion to the thickness of the first portion is in a range of 0.3 to 0.6 and that a ratio of the thickness of the third portion to the thickness of the first portion is in a range of 0.25 to 0.40.

5. The printed wiring board according to claim 1, wherein the seed layer is formed by sputtering.

6. The printed wiring board according to claim 1, wherein the seed layer of the second conductor layer and via conductor is formed such that the at least one metal in the alloy of the first layer includes silicon and that a silicon content in the alloy is in a range of 0.5 at % to 10.0 at %.

7. The printed wiring board according to claim 1, wherein the seed layer of the second conductor layer and via conductor is formed such that an aluminum content in the alloy of the first layer is in a range of 1.0 at % to 15.0 at %.

8. The printed wiring board according to claim 1, wherein the seed layer of the second conductor layer and via conductor is formed such that the alloy of the first layer includes carbon and that a carbon content in the alloy of the first layer is 50 ppm or less.

9. The printed wiring board according to claim 1, wherein the seed layer of the second conductor layer and via conductor is formed such that the alloy of the first layer includes oxygen and that an oxygen content in the alloy of the first layer is 100 ppm or less.

10. The printed wiring board according to claim 2, wherein the seed layer of the second conductor layer and via conductor is formed such that the thickness of the second portion in the first layer is equal to or greater than the thickness of the third portion in the first layer and that the thickness of the second portion in the second layer is equal to or greater than the thickness of the third portion in the second layer.

11. The printed wiring board according to claim 2, wherein the seed layer of the second conductor layer and via conductor is formed such that a ratio of the thickness of the second portion to the thickness of the first portion is in a range of 0.3 to 0.6 and that a ratio of the thickness of the third portion to the thickness of the first portion is in a range of 0.25 to 0.40.

12. The printed wiring board according to claim 2, wherein the seed layer of the second conductor layer and via conductor is formed such that the at least one metal in the alloy of the first layer includes silicon and that a silicon content in the alloy is in a range of 0.5 at % to 10.0 at %.

13. The printed wiring board according to claim 2, wherein the seed layer of the second conductor layer and via conductor is formed such that an aluminum content in the alloy of the first layer is in a range of 1.0 at % to 15.0 at %.

14. The printed wiring board according to claim 2, wherein the seed layer of the second conductor layer and via conductor is formed such that the alloy of the first layer includes carbon and that a carbon content in the alloy of the first layer is 50 ppm or less.

15. The printed wiring board according to claim 2, wherein the seed layer of the second conductor layer and via conductor is formed such that the alloy of the first layer includes oxygen and that an oxygen content in the alloy of the first layer is 100 ppm or less.

16. The printed wiring board according to claim 3, wherein the seed layer of the second conductor layer and via conductor is formed such that a ratio of the thickness of the second portion to the thickness of the first portion is in a range of 0.3 to 0.6 and that a ratio of the thickness of the third portion to the thickness of the first portion is in a range of 0.25 to 0.40.

17. The printed wiring board according to claim 3, wherein the seed layer of the second conductor layer and via conductor is formed such that the at least one metal in the alloy of the first layer includes silicon and that a silicon content in the alloy is in a range of 0.5 at % to 10.0 at %.

18. The printed wiring board according to claim 3, wherein the seed layer of the second conductor layer and via conductor is formed such that an aluminum content in the alloy of the first layer is in a range of 1.0 at % to 15.0 at %.

19. The printed wiring board according to claim 3, wherein the seed layer of the second conductor layer and via conductor is formed such that the alloy of the first layer includes carbon and that a carbon content in the alloy of the first layer is 50 ppm or less.

20. The printed wiring board according to claim 3, wherein the seed layer of the second conductor layer and via conductor is formed such that the alloy of the first layer includes oxygen and that an oxygen content in the alloy of the first layer is 100 ppm or less.

* * * * *